United States Patent
Solon

(10) Patent No.: US 10,347,775 B2
(45) Date of Patent: Jul. 9, 2019

(54) SOLAR ARRAY RECOMBINER BOX WITH WIRELESS MONITORING CAPABILITY

(75) Inventor: Dean Solon, Gallatin, TN (US)

(73) Assignee: SHOALS TECHNOLOGIES GROUP, LLC, Portland, TN (US)

( * ) Notice: Subject to any disclaimer, the term of this patent is extended or adjusted under 35 U.S.C. 154(b) by 293 days.

(21) Appl. No.: 12/871,234

(22) Filed: Aug. 30, 2010

(65) Prior Publication Data

US 2012/0048328 A1  Mar. 1, 2012

(51) Int. Cl.
- *G01D 4/00* (2006.01)
- *H01L 31/02* (2006.01)
- *H02S 50/10* (2014.01)

(52) U.S. Cl.
CPC ....... *H01L 31/02021* (2013.01); *G01D 4/002* (2013.01); *H02S 50/10* (2014.12); *H01L 2924/0002* (2013.01); *Y02B 70/346* (2013.01); *Y02B 90/241* (2013.01); *Y02E 10/50* (2013.01); *Y04S 20/32* (2013.01); *Y04S 20/525* (2013.01)

(58) Field of Classification Search
CPC .............. G01R 31/405; G01R 31/2605; H01H 50/042; H01L 31/02021; H01L 2924/0002; H02S 50/10; Y02B 70/346; Y04S 20/23; Y04S 20/525; G01D 4/002
USPC ...................................................... 310/49.13
See application file for complete search history.

(56) References Cited

U.S. PATENT DOCUMENTS

| | | | |
|---|---|---|---|
| 4,287,382 A | 1/1981 | French | |
| 4,257,087 A * | 3/1981 | Cuk | 363/16 |
| 4,490,668 A * | 12/1984 | Sterzer | 322/2 R |
| 4,692,754 A * | 9/1987 | Edejer et al. | 340/671 |
| 4,894,764 A * | 1/1990 | Meyer et al. | 363/65 |
| 5,573,200 A | 11/1996 | Sato et al. | |
| 6,437,700 B1 * | 8/2002 | Herzfeld et al. | 340/650 |
| 7,602,080 B1 * | 10/2009 | Hadar et al. | 307/20 |
| 2006/0027677 A1 | 2/2006 | Abts | |
| 2006/0237058 A1 * | 10/2006 | McClintock et al. | 136/244 |
| 2007/0239481 A1 * | 10/2007 | DiSilvestro et al. | 705/2 |
| 2008/0144294 A1 * | 6/2008 | Adest | H05K 7/1432 361/730 |
| 2008/0147335 A1 * | 6/2008 | Adest et al. | 702/64 |
| 2008/0264474 A1 * | 10/2008 | Frauenknecht et al. | 136/251 |
| 2009/0012917 A1 * | 1/2009 | Thompson | G06Q 50/06 705/412 |
| 2009/0159113 A1 * | 6/2009 | Morimoto | 136/244 |
| 2009/0207543 A1 * | 8/2009 | Boniface et al. | 361/86 |
| 2009/0302831 A1 | 12/2009 | Adams et al. | |
| 2010/0085670 A1 | 4/2010 | Palaniswami et al. | |
| 2010/0116325 A1 * | 5/2010 | Nikoonahad | 136/251 |
| 2010/0126550 A1 * | 5/2010 | Foss | G05F 1/67 136/244 |
| 2011/0050218 A1 * | 3/2011 | Lohss | G01R 33/072 324/251 |

(Continued)

*Primary Examiner* — Susan D Leong
*Assistant Examiner* — William E McClain
(74) *Attorney, Agent, or Firm* — Carla Gannon Law

(57) ABSTRACT

A system for monitoring and wirelessly transmitting solar array parameters such as current, voltage and temperature in real time is primarily housed within a recombiner box. The system lends itself to retrofitting within some commercially available recombiner boxes. Signals emitted from the RF controller component of the system are received by a central processor, which includes a dashboard interface. Multiple systems in proximity can be linked to form a mesh network with one central processor.

14 Claims, 16 Drawing Sheets

(56) References Cited

U.S. PATENT DOCUMENTS

2011/0058337 A1* 3/2011 Han et al. .................... 361/717
2011/0121984 A1* 5/2011 Schripsema ...... H01L 31/02021
                                                              340/635
2012/0049855 A1* 3/2012 Crites ............... H01L 31/02021
                                                              324/537

* cited by examiner

FIG. 10G

SOLAR ARRAY RECOMBINER BOX WITH WIRELESS MONITORING CAPABILITY

BACKGROUND (1) Field

The present invention relates generally to recombiner boxes used in the solar industry and, more particularly, to recombiner boxes capable of monitoring the energy output of solar panels in an array, and wirelessly transmitting output data to a central processor.

(2) Related Art

As the world's energy demands have increased, it has become clear that dependence on non-renewable resources is not sustainable from a supply or environmental standpoint. Thus, more attention is being paid to so-called alternative energy such as wind and solar. This attention has led to significant advances in alternative energy technology, to the point that utility companies are increasingly interested in solar generated energy. However, the large-scale production of solar energy requires infrastructure beyond a sunny field full of solar collectors.

Solar collectors, by design, are typically somewhat fragile. In addition, for high-output production, for example utility scale production, collectors are usually spread over a large outdoor area. Given the propensity to break, and the exposure to outdoor variations and hazards, solar collectors experience fluctuations in energy output, technical difficulties, and/or outright failure. Thus, in order to maximize efficiency of a solar energy system, it is important to be able to monitor the solar collectors in an array.

Others have attempted to monitor the output of solar arrays, but known systems are wired, complicated, cumbersome, not amenable to retrofitting pre-existing combiner boxes, and/or difficult to integrate with an existing system.

Thus, there remains a need for a monitoring system that wirelessly monitors the energy output of solar panels in an array. Preferably this system can be integrated with currently existing recombiner boxes to provide retrofitted monitoring capability. Preferably this system powers itself from the collected solar energy, and stores energy for use during lulls, for example through the evening. Preferably this system can communicate wirelessly with other recombiner boxes, thereby creating a mesh network wherein recombiner boxes can reroute their communication if one path is lost. Preferably this system can alert a user when a certain condition is met, for example if the current of an array is significantly lower than another comparable array. Preferably this system is relatively easy and inexpensive to manufacture, transport, install and maintain.

SUMMARY OF THE INVENTIONS

The present invention is directed to a system for monitoring the current and voltage output of solar panels in a solar array. This data is collected by a device that is predominately located in a recombiner box, including a sensor control module, brain, RF controller, power brick and terminal block. The RF controller sends signals to a remote central processor, which in turn makes the processed data available, for example on the internet, for authorized users. In this sense the central processor acts as a gateway. The central processor includes a dashboard interface for displaying various data, such as current, voltage and temperature. The system can be configured to monitor panels in one array, as described above, or so that multiple systems communicate with each other in a mesh network, with data ultimately being received by the central processor.

The sensor control module "plugs" into fuses in a recombiner box, with each fuse in the recombiner box corresponding with one string of solar panels in a solar array. In this manner the sensor control module monitors the system for, for example, degradation in current, which could indicate a solar panel in an array is not operating properly. The sensor control module is L-shaped, and can be fitted into commercially available recombiner boxes. Alternatively, recombiner boxes can be built including the monitoring system. The sensor control module includes a plurality of magnetized cores and Hall effect sensors for measuring the current for each array of solar panels. The sensor control module also includes a connection to a bus bar, for measuring the voltage of the entire array. The brain assimilates this data and sends it to the RF controller for dissemination to other receivers in the mesh network, or to the central processor.

The monitoring system is powered by energy it taps from the array, and includes a battery pack and charger for continuous power through solar array output lulls. The monitoring system could also be configured for non-parasitic installations.

These and other aspects of the present inventions will become apparent to those skilled in the art after a reading of the following description of the preferred embodiment when considered with the drawings.

BRIEF DESCRIPTION OF THE DRAWING

FIG. 10 provides screen shots of an example user interface, more specifically with:

FIG. 10G showing a combiner alert; and

DESCRIPTION OF THE PREFERRED EMBODIMENTS

Figure 1:
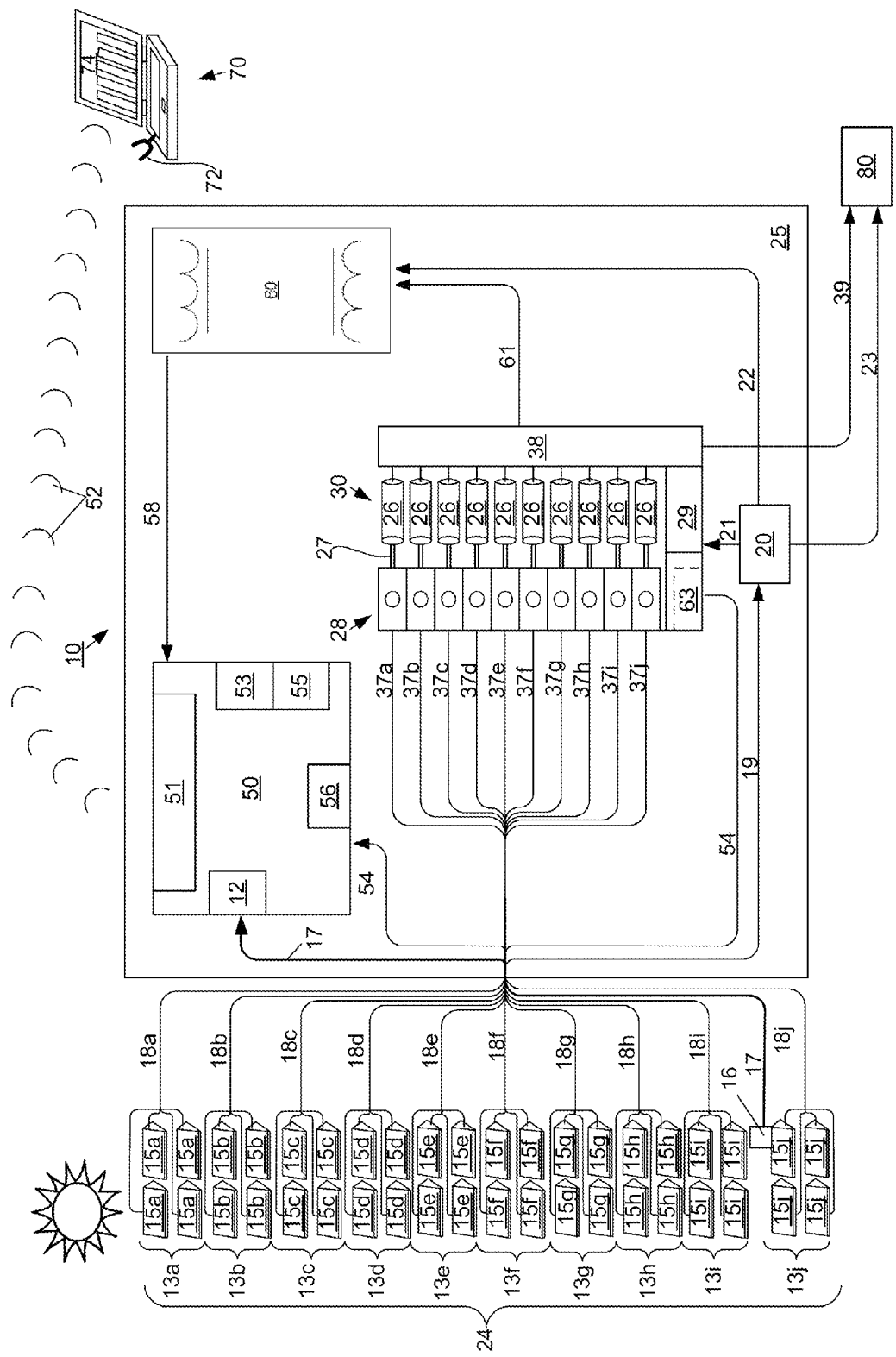
FIG. 1 schematically represents an overview of an embodiment of a monitoring system.

In the following description, like reference characters designate like or corresponding parts throughout the several views. It should be understood that the following descriptions and illustrations describe preferred embodiments of the inventions, but are not intended to limit the inventions thereto.

The following structure numbers shall apply to the following structures among the various FIGS.:
- 10—Monitoring system;
- 12—Temperature circuit;
- 13—Solar array;
- 15—Solar panel;
- 16—Temperature sensor;
- 17—Temperature sensor data output;
- 18—Monitoring input branch;
- 19—First HV return;
- 20—Terminal block;
- 21—Second HV return;
- 22—Third HV return;
- 23—Fourth HV return;
- 24—Set of arrays;
- 25—Recombiner box
- 26—Fuses;
- 27—Fuse bars;
- 28—Leg;
- 29—Foot;
- 30—Sensor control module;
- 31—Leg base;
- 32—Leg lid;
- 33—Leg end cap;
- 34—End cap spring clip;
- 35—Aperture;
- 36—Locking mechanism;
- 37—Sensor control module current inputs;
- 38—Bus bar;
- 39—First HV supply;
- 40—Bobbin;
- 41—Screw assembly;
- 42—Bobbin input terminal;
- 43—Windings;
- 44—Bobbin output terminal;
- 45—Core;
- 46—Flexible circuit board;
- 47—Pad stack;
- 48—Hall-effect sensor;
- 49—Notches;
- 50—RF controller;
- 51—Antennae;
- 52—RF signal;
- 53—Power supply;
- 54—Control module multi-conductor cable;
- 55—Battery;
- 56—Charger;
- 58—RF controller low voltage and ground;
- 60—Power brick;
- 61—Second HV supply;
- 63—Brain;
- 64—Boot base;
- 65—Printed circuit board;
- 66—Foot lid;
- 70—Processor;
- 72—RF dongle;
- 74—Dashboard;
- 80—Inverter;
- 82—Movable plate;
- 83—Screw lock box;
- 84—Screw lock clamp;
- 85—Clamp screw;
- 86—Three-point terminal;
- 87—Tab;
- 88—String monitor terminal;
- 90—Gap;
- 91—Flex circuit holders;
- 92—Flex board cut outs;
- 95—Mesh network;
- 110—User interface;
- 112—Overview bar;
- 114—Navigation bar;
- 116—Preview graph;
- 118—Lifetime graph;
- 120—Site level sample graph;
- 122—Site level preview graph;
- 124—Site map;
- 126—Combiner bar;
- 128—Site level alert;
- 130—Combiner lifetime graph;
- 132—Combiner lifetime preview graph;
- 134—Navigation tabs;
- 136—Combiner navigation;
- 138—Drill-down filter;
- 140—Combiner sample graph;
- 142—Combiner sample preview graph;
- 144—Combiner alert;
- 146—Combiner string level graph;
- 148—String selection;
- 150—Selection bar; and
- 152—Badge.

As used herein, "recombiner box" and "combiner box" are interchangeable terms, and the inventions can be used with either configuration.

FIG. 1 provides an overview of monitoring system 10 and some associated interconnections. Solar panels 15, individually designated as 15a, 15b, 15c and so on, collectively form corresponding solar arrays 13a, 13b, 13c and so on. Solar panels 15 are wired to system 10 by monitoring input branch 18, with individual wires designated as 18a, 18b 18c and so on, corresponding to individual solar arrays 13a, 13b, 13c and so on. Temperature sensor 16 preferably measures ambient, but can also measure the temperature of specific components of panel 15. FIG. 1 depicts temperature sensor 16 associated with only array 13j, but it should be understood that it is preferable that at least solar panel 15 in each array 13 includes one temperature sensor 16.

The major components of system 10 include temperature circuit 12, terminal block 20, sensor control module 30, RF controller 50, power brick 60, and processor 70. Power leaving system 10 goes to inverter 80, in accordance with known solar power generation architecture.

Temperature circuit 12 is connected to temperature sensor 16 by temperature sensor data output 17. Array 13 preferably includes only a single, properly positioned temperature sensor 16, as the temperature reported from one panel 15 can be representative of all panels, and more than one properly positioned temperature sensor would likely be unnecessarily redundant. Temperature circuit 12 is integrated with RF controller 50, with the latter transmitting temperature data RF signals 52 to processor 70.

System 10 also includes terminal block 20, with first, second, third and fourth high voltage returns 19, 21, 22 and 23, respectively, which are on a common node, as shown in FIG. 1. As would be understood by those in the art, high voltage returns 19, 21, 22 and 23 create a complete negative high voltage path, thereby delivering high voltage return from terminal block 20 to power brick 60. Bus Bar 38 is high voltage positive (+)

Power brick 60 powers system 10 by diverting high voltage from other components in the system, and stepping down the voltage to lower voltage, preferably 14V. As used herein, "high voltage" is at least 600V, and preferably 600V, 1000V or 1500V. Third high voltage return 22 and second high voltage supply 61 deliver high voltage from terminal block 20(−) and bus bar 38(+), respectively, to power brick 60. First high voltage supply 39 delivers high voltage from bus bar 38 to inverter 80, and therefore, like second high voltage supply 61, has the same potential as bus bar 38. Power brick 60 supplies 14V power and ground to RF controller 50, and to the components associated with sensor control module 30 via RF controller 50.

RF controller 50 is in communication with, and receives current and voltage data from brain 63 of sensor control module via control module multi-conductor cable 54. RF controller 50 also receives temperature data from temperature sensor 16 via temperature sensor data output 17. These data are transmitted by antennae 51 as RF signals 52 to processor 70. RF controller 50 preferably includes RF engine (not shown) which is a product of Synapse Wireless Incorporated in Huntsville, Ala., and commercially available as RF100PC6 from Future Electronics in Huntsville, Ala.

RF controller 50 also includes power supply/voltage regulator 53, charger 56 and battery pack 55. Power supply/voltage regulator 53 is fed by RF controller low voltage and ground 58. Those in the art will understand that RF controller low voltage and ground 58 is a multiconductor cable, but conducts voltage and ground only. Charger 56 is powered by power supply/voltage regulator 53. Battery pack 55 includes a circuit board for dealing with over-temperature, and for shutting down and monitoring capability. Battery pack 55 is necessary because solar power collected on-the-fly is not always adequate to power the system. For example, current available to power the system varies according to time of day, weather, and whether or not the system is functioning properly. Battery pack 55 ensures system 10 continues operating regardless of power generated. Preferably battery pack 55 is 3.6 V. Preferred battery pack 55 can be purchased as part number XSS-ICR18650-22-PC from House of Batteries, in Fountain Valley, Calif.

Processor 70 includes RF dongle 72, which receives RF signals 52 emitted by antennae 51 of RF controller 50. Processor 70 can be a standard desktop, laptop computer, or industrial PC, which has access to, or has been loaded with, appropriate "dashboard" software, and preferably includes Synapse Wireless Incorporated of Huntsville, Ala.'s gateway adaptor, which is commercially available as RF100PC6 from Future Electronics in Huntsville, Ala. The minimum performance specifics of processor 70 vary according to the number of solar arrays 13, and therefore amount of data to be processed. RF dongle 72 is a product of Synapse Wireless Incorporated in Huntsville, Ala., and is commercially available as SN-132HO-NR from Future of Electronics of Huntsville, Ala.

Screen shots from a representative dashboard program are set forth in FIG. 10. "Dashboard" software preferably includes an interface which displays data such as current, voltage, weather, and/or temperature in a user friendly manner. Specifically, user should be able to ascertain current (ie Amps), temperature and cumulative voltage for each solar array 13. Preferably, with all graphs and data displays, a user can mouse over any specific data point, and the interface will display the data collected at that point in time. It is also preferable that all information is contained in a single display with a navigation bar and "lightbox" effect providing the only two navigation elements. Specifically, it is preferred that the primary elements are navigable using the bar, but that the detailed view of any element is found in a "lightbox" overlay. In this manner the user can easily return to the main screen and back out of a high resolution view by simply clicking outside or closing the lightbox. This reduces the time required to use the system, and overall click count.

Figure 10A:
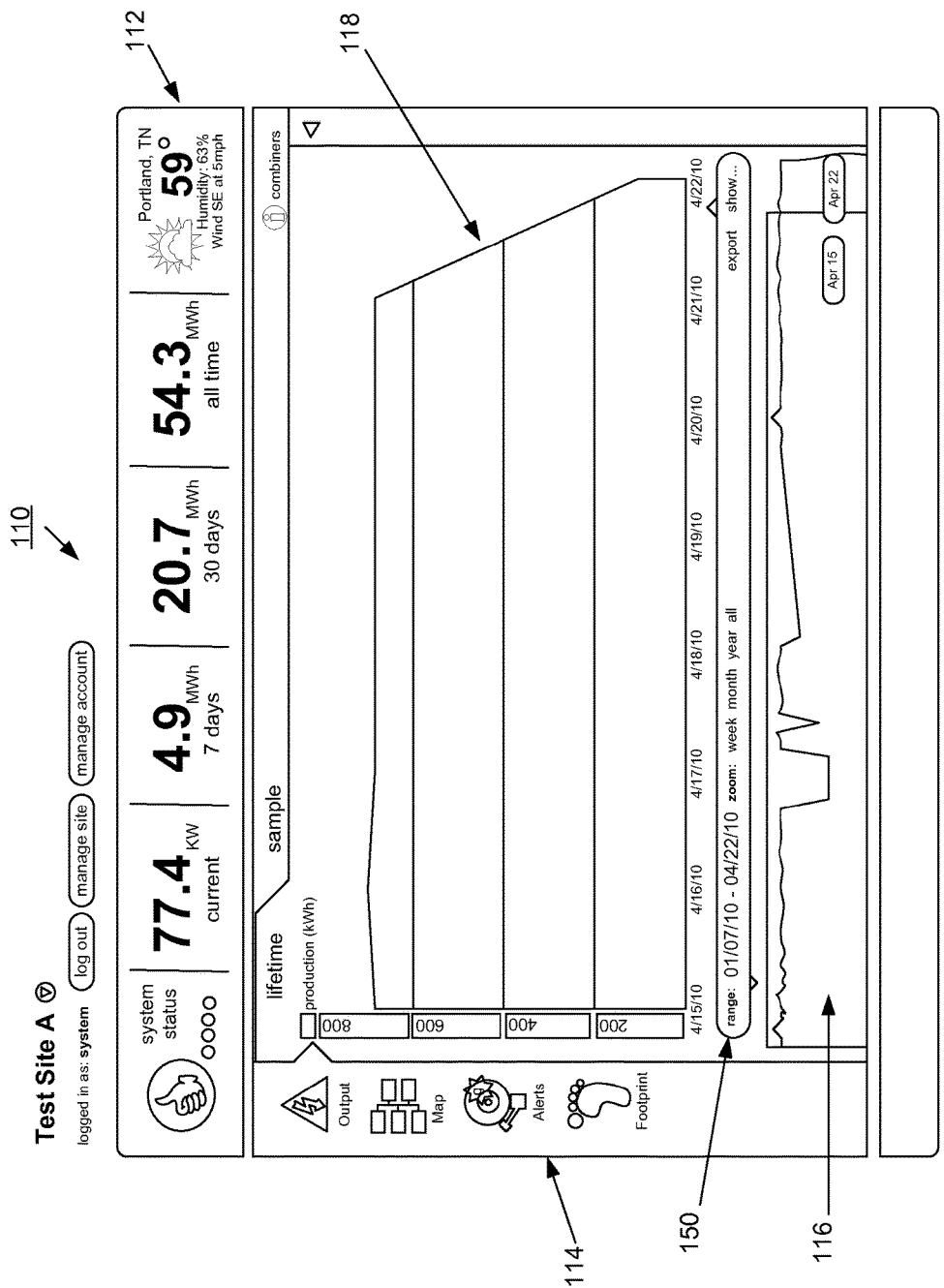
FIG. 10A showing a lifetime and preview graph.

Referring now to FIG. 10A, user interface 110 includes overview bar 112, which displays the system status in "real time". As used herein, "real time" means data points are collected in accordance with the polling rate of the system, for example every 5 seconds. The polling rate is selectable by the user. Preferably, reported parameters include current; 7 day, 30 day and lifetime power output; and weather. Overview bar 112 is present throughout all views, as depicted in FIGS. 10A-10H. Navigation bar 114 provides quick access to the four major sections of the system: output graphs, site map, alerts and environmental footprint data. Lifetime graph 118 visually represents system data collected over the lifetime of the system. Power output, current, voltage, temperature, irradiance, humidity, wind speed and alert counts can be plotted on top of lifetime graph 118 by clicking "show" and selecting the data to display. A user can select a time range by clicking and dragging on lifetime graph 118, thereby creating an overview of weather and alerts in the preview graph 116. A user automatically transitions to "Sample View" by clicking inside of the selected range, thereby displaying a higher resolution sample of data.

Preview graph 116 shows a miniature representation of the system over its lifetime. A user can click and drag to select a range, or select a quick zoom in selection bar 150, such as week, month or year. The selected range is displayed in lifetime graph 118.

Figure 10B:
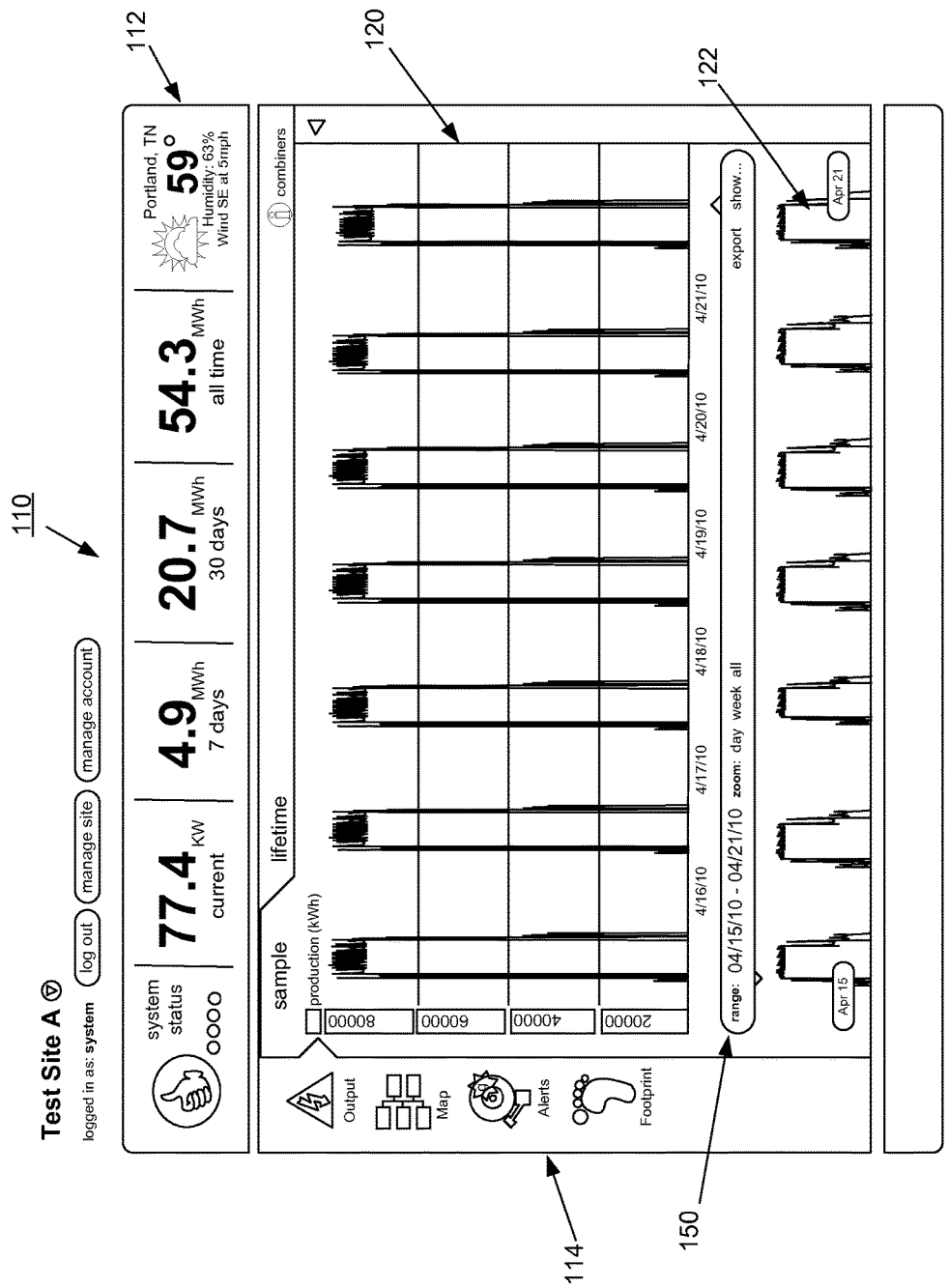
FIG. 10B showing a site level sample graph and site level preview graph.

Referring now to FIG. 10B, site level sample graph 120 displays the data set for a selected range, which has been selected in lifetime graph 118 or selection bar 150. Similar to other graphs in user interface 110, one can plot additional data by selecting the "Show" button. These data points are in real time while lifetime graph 118 collects data daily, or at another increment.

Figure 10C:
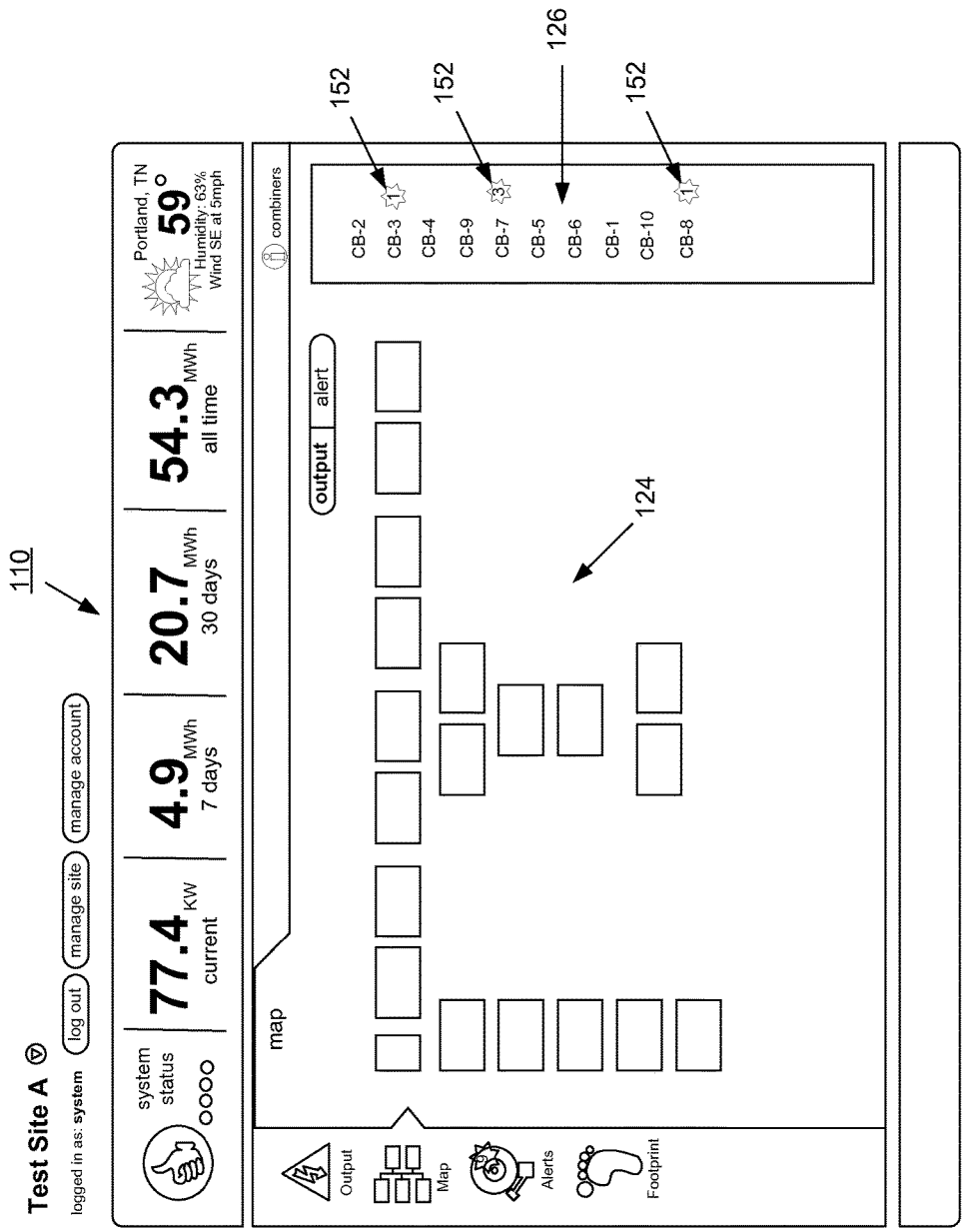
FIG. 10C showing a site map.

The dashboard technology is capable of importing the combiner layout (ie graphic representation of where specific combiner boxes are physically located relative to each other) from an external site plan, and displaying that layout as site map 124, shown in FIG. 10C. Site map 124 displays current output, and is further divided according to which specific combiner boxes service each section. It is preferable that power output in combiner bar 126 is further emphasized by displaying in bright green at high output, thereby facilitating a quick overview of function, and the ability to quickly identify problems. Badge 152 indicates the alert count and priority of the alerts occurring at that combiner.

It is further preferable that mousing over any section of site map 124 results in a tool tip pop up (not shown) that displays the real-time power, current and voltage, and the combiner ID for that section, in addition to highlighting it in the combiner bar 126.

Figure 10D:
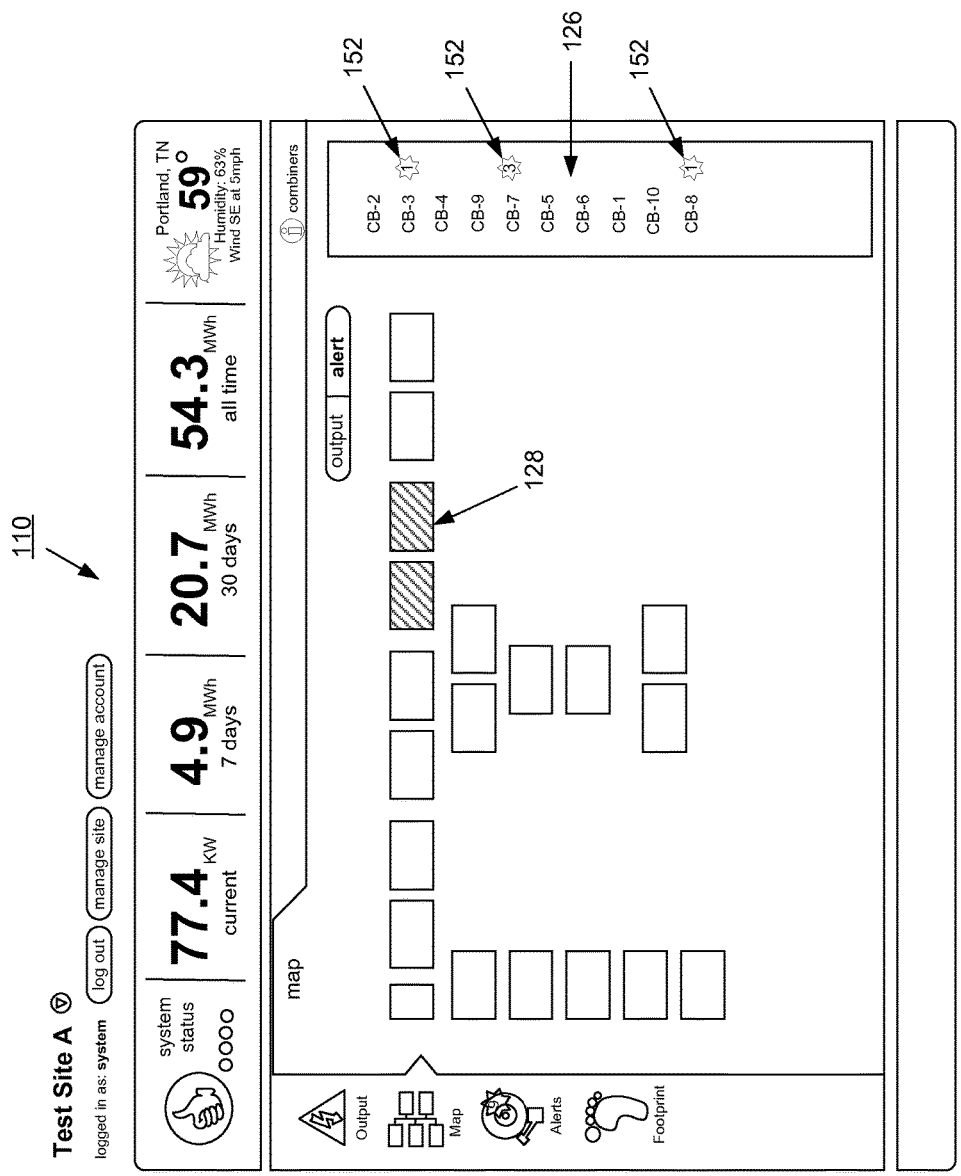
FIG. 10D showing a site level alert.

Site level alert 128, as shown in FIG. 10D, provides a graphical representation of where alerts exist in the field. Alerts are represented by colors, for example green for the lowest level alerts which do not affect performance, yellow for medium level alerts which affect performance, and red for critical alerts. Clicking on the colored section displays the alert in an alerts lightbox window, not shown.

Figure 10E:
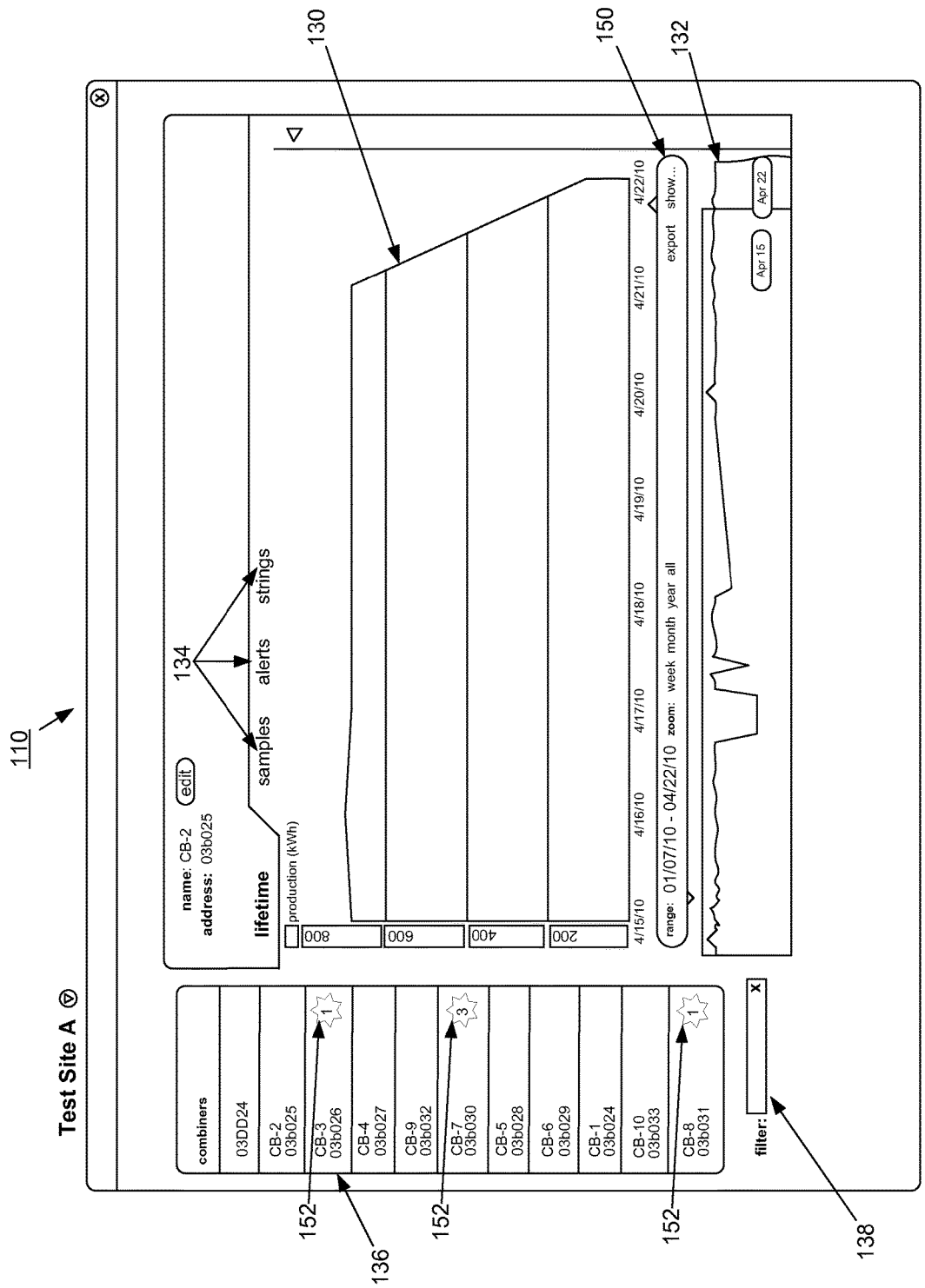
FIG. 10E showing a combiner graph and a combiner lifetime preview graph.

FIG. 10E depicts a combiner view, including navigation tabs 134 correlating to "Samples", "Alerts", and "Strings". Clicking the alert tab enables the user to view the alerts for a particular combiner box. Note that combiner alerts in combiner navigation 136 indicate badges 152 as well as identifying the particular combiner. Specific combiner boxes 25 in the field can be selected using combiner navigation bar 136. Drill-down filter 138 allows for quick selection of a combiner box 25 when working with large numbers. As the user types the name of combiner box 25 the list to the left filters down, narrowing the selection to help the user quickly find the desired combiner box 25.

Figure 10F:
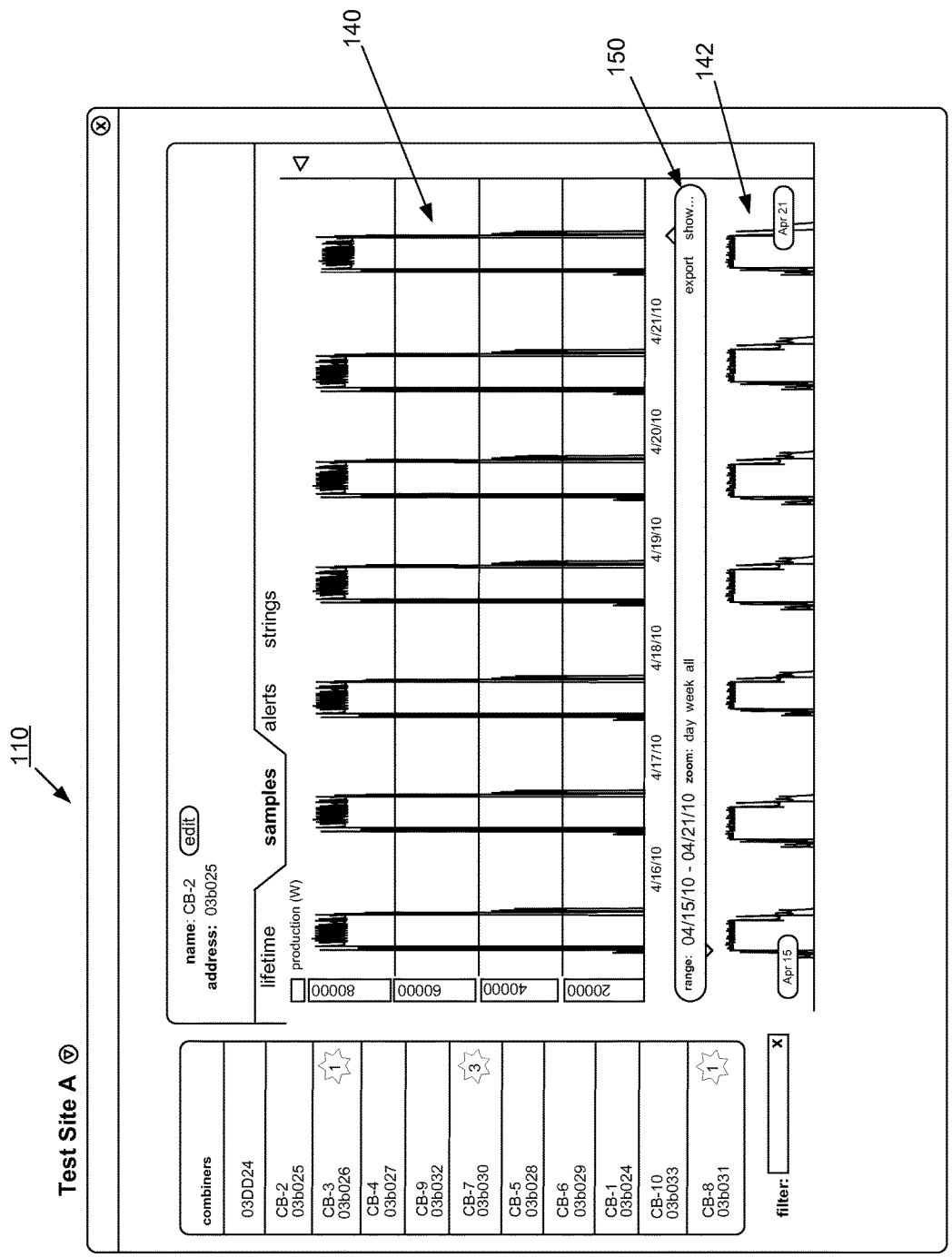
FIG. 10F showing a combiner sample graph and combiner sample preview graph.
Figure 10G:
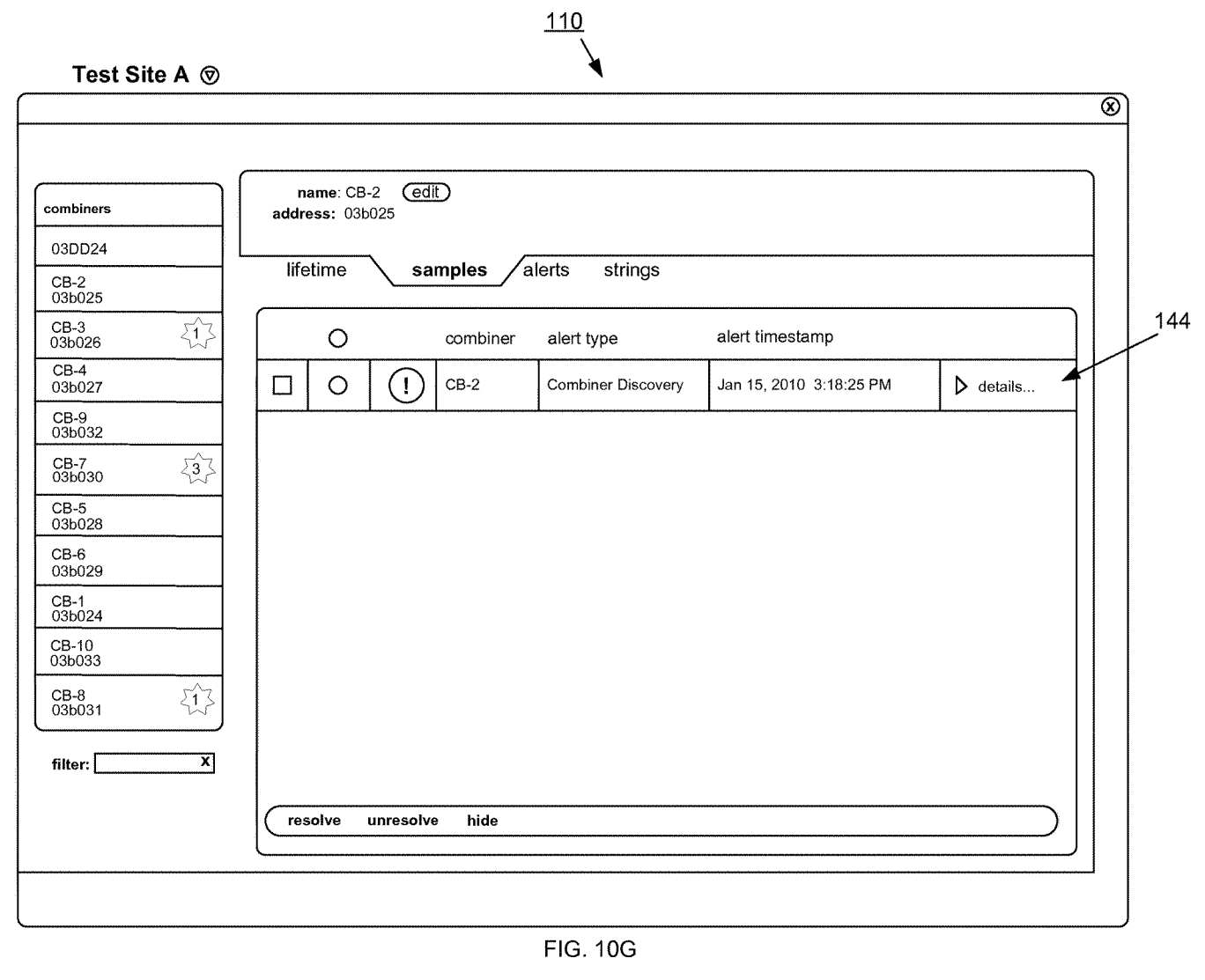
Figure 10H:
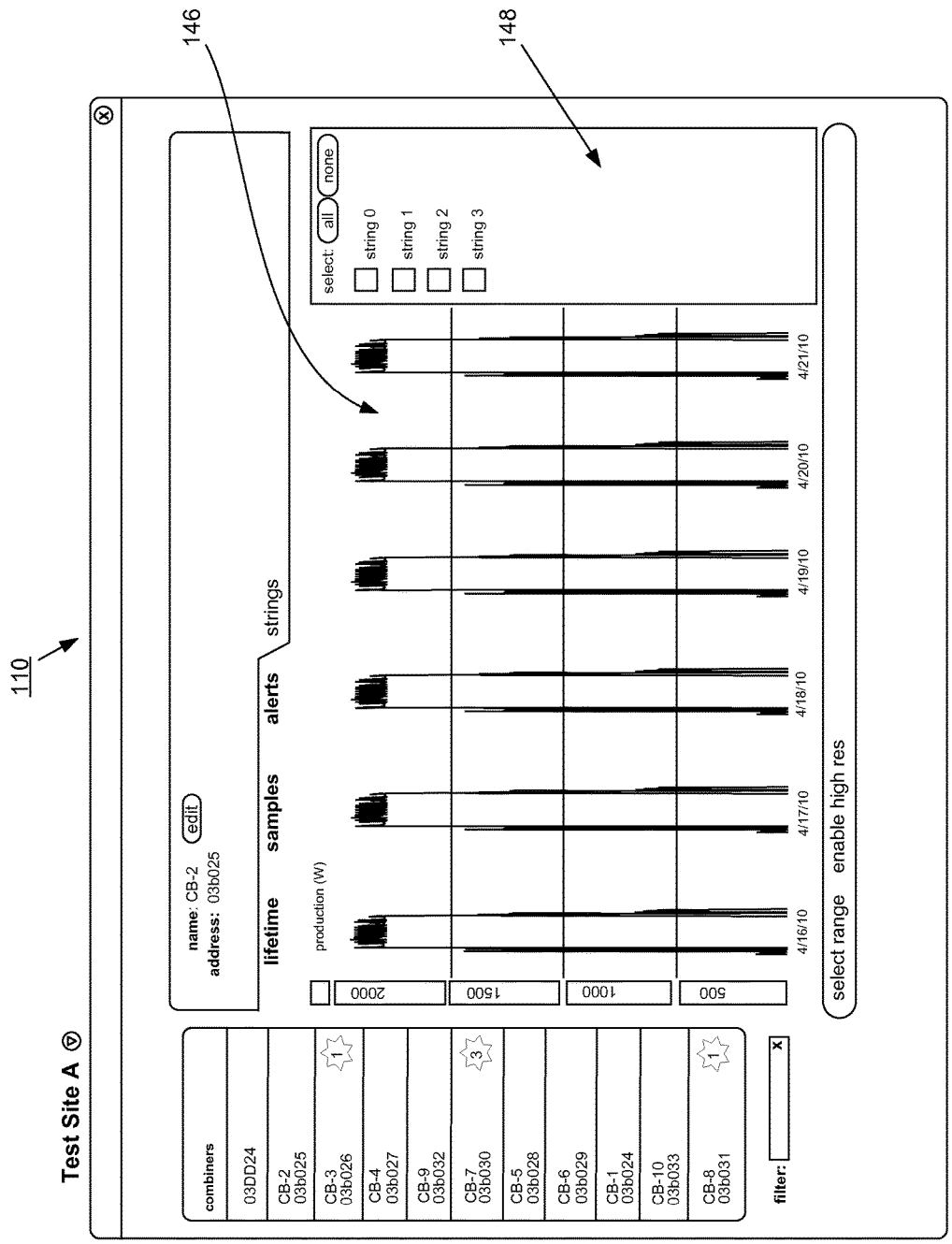
FIG. 10H showing a combiner string level graph.

Referring now to FIG. 10F, combiner sample graph 140 is slightly different than the others previously discussed insofar as the user is not looking at the rollup data. Instead, they are seeing the individual string readings for each combiner. Clicking "Show" turns on and off the display of strings in the graph as well as plots additional data over top. FIGS. 10G and 10H show the history of alerts for CB2, with 10H showing the individual strings.

Processor 70 preferably also includes functionality to remotely alert users when certain threshold data, or combinations of data, are received. By way of example, a sudden and significant decrease in current for a given array 13 may indicate a problem with an individual solar panel 15. Suitable alerts could be communicated via telephone, text messaging, emails, beepers, sirens or the like.

Sensor control module 30 is the "nerve center" of system 10. As shown in FIG. 1, module 30 includes a longer portion, leg 28, which is positioned parallel to the row of fuses 26, and measures the current of associated solar panels 15. Attached approximately perpendicular to one end of leg 28 is a shorter portion, foot 29, which contains brain 63 of the system. Attached approximately perpendicular to the other end of foot 29, is bus bar 38, which is used for determining overall voltage of array 13. This "L-shaped" design ("U-shaped" including bus bar 38) lends itself to integration with commercially available recombiner boxes, thereby allowing currently existing recombiner boxes to be retrofitted with sensor control module 30. An example of a commercially available recombiner box amenable to retrofit is the STG-CBC-16 from Shoals Technologies Group in Portland, Tenn. It is also possibly to modify almost any recombiner box to allow retrofitting, although the configuration of the recombiner box may render this a cumbersome task. Also, sensor control module 30 can be integrated with recombiner boxes at time of manufacturing/assembly.

Figure 2:
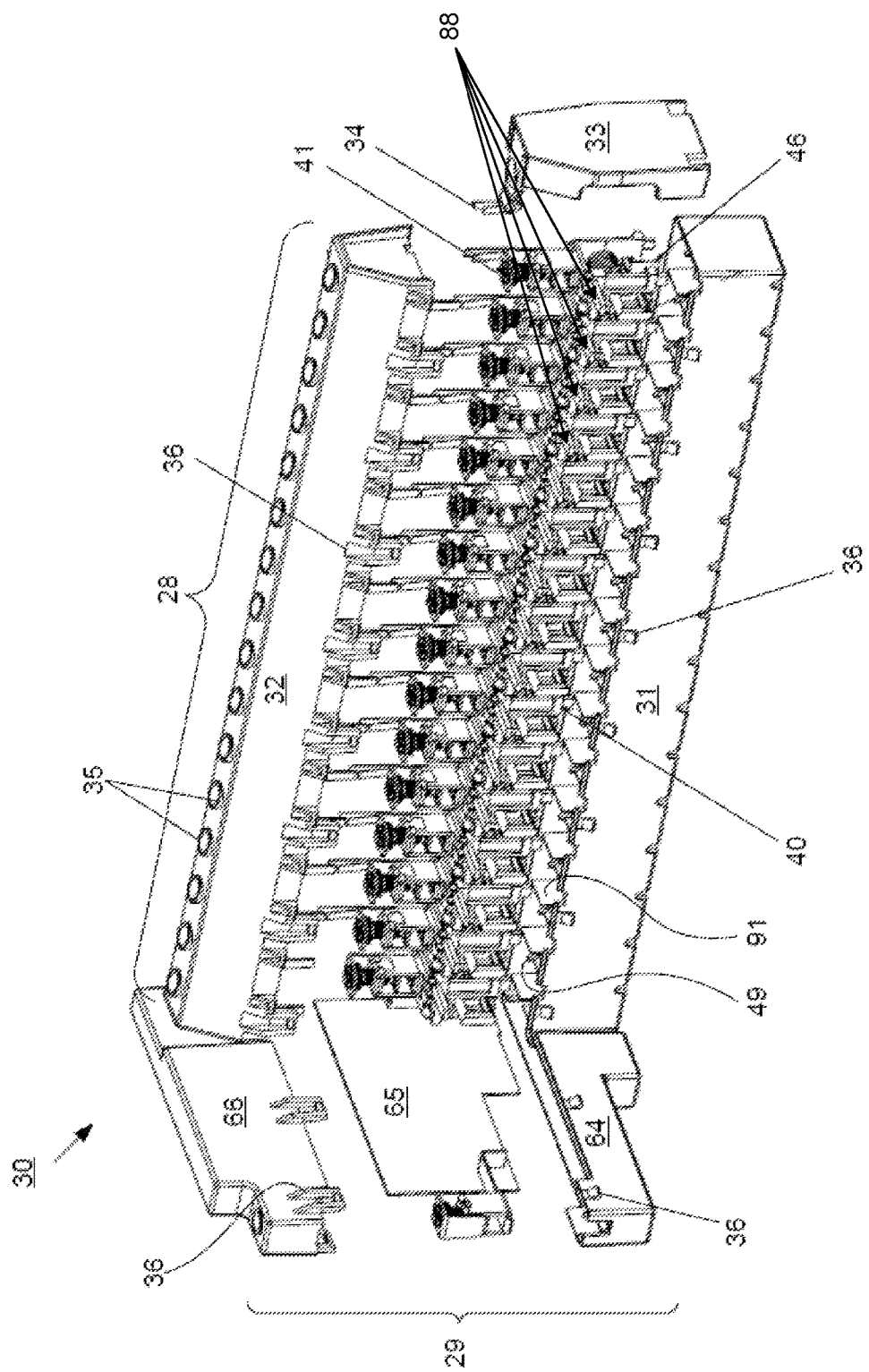
FIG. 2 is an exploded, perspective view of a sensor control module.
Figure 3:
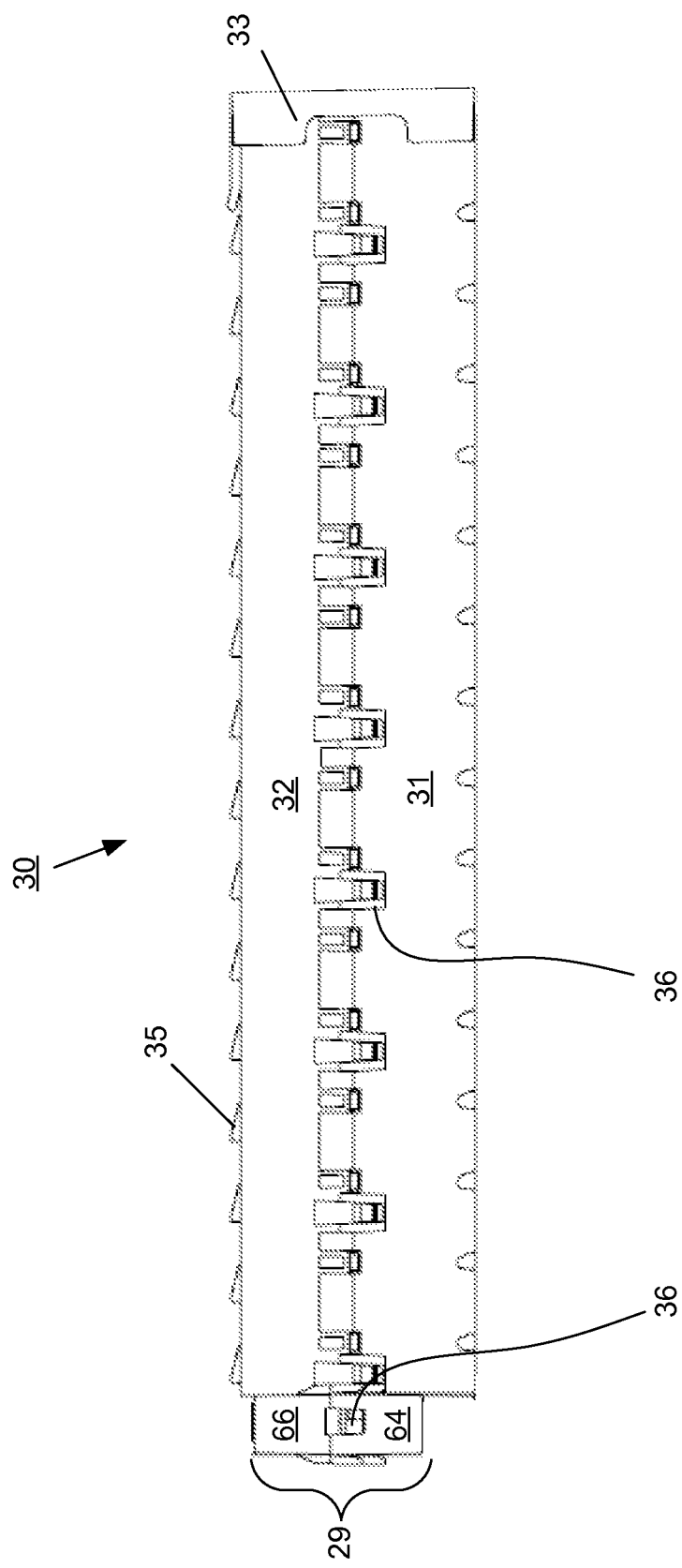
FIG. 3 is a side view of a sensor control module.
Figure 4:
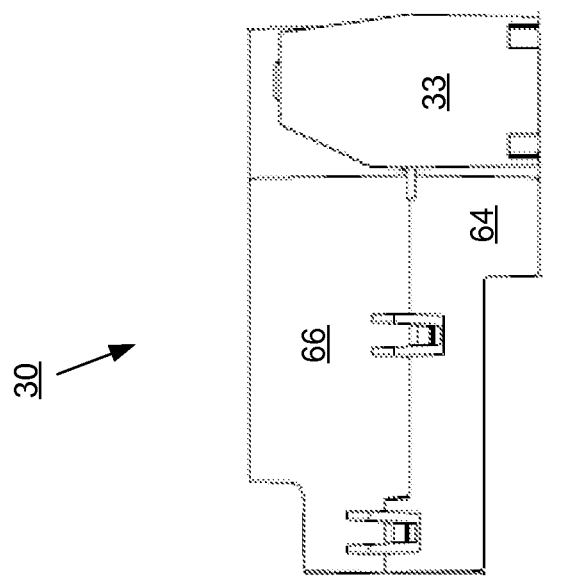
FIG. 4 is an end view of a sensor control module.

Referring to FIG. 2, leg 28 includes leg lid 32, defining a plurality of apertures 35, corresponding to the number of fuses 26, which corresponds with the number of associated arrays 13. Leg lid 32 includes a plurality of locking mechanisms 36 each mating with locking mechanisms 36 of leg base 31. The "free" end of leg 28 includes leg end cap 33, which covers the end of leg lid 32 and leg base 31. Foot 29 includes lid 66 and boot base 64, and is held together by mating locking mechanisms 36. Although sensor control module 30 is discussed herein as comprising leg 28 and foot 29, it should be understood that leg 28 and foot 29 are not separable parts, rather, they are discussed separately for purposes of more clearly describing the structure of the overall system.

Figure 6:
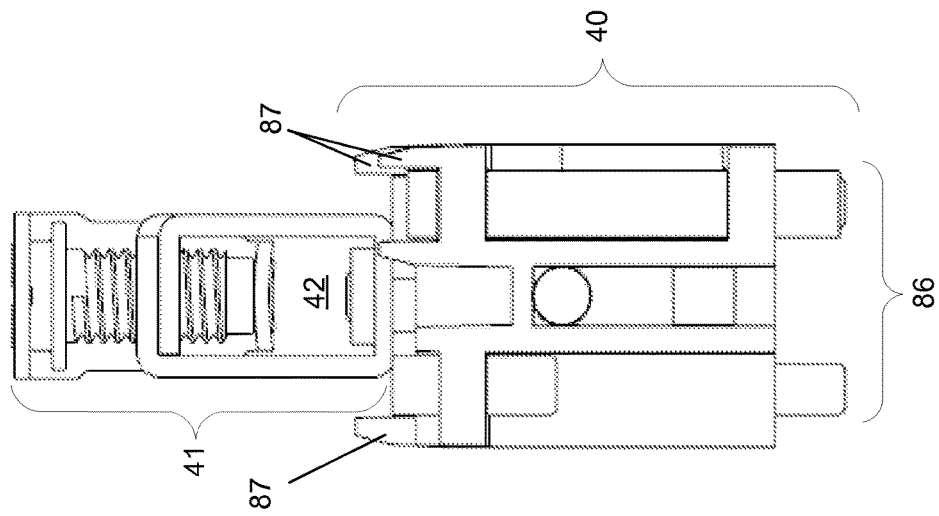
FIG. 6 is a side view of a screw assembly and bobbin.
Figure 5:
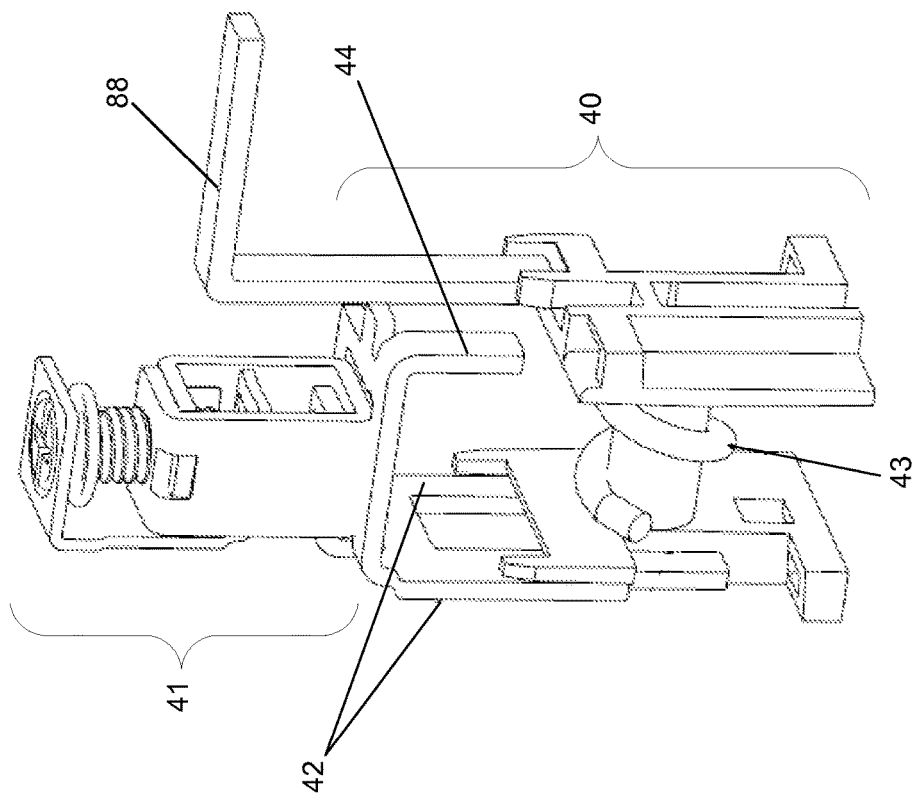
FIG. 5 is a perspective view of a screw assembly and bobbin.
Figure 7:
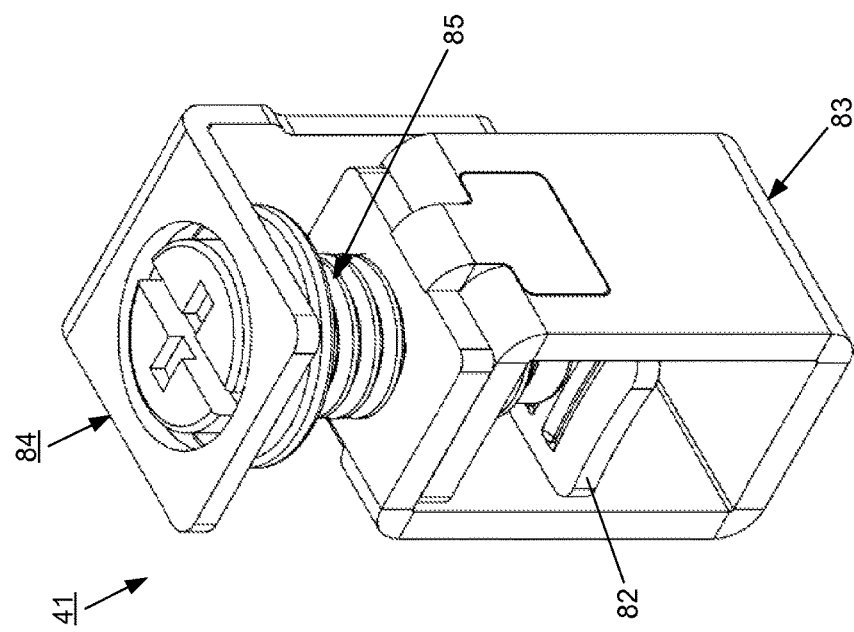
FIG. 7 is a perspective view of a screw assembly.
Figure 9:
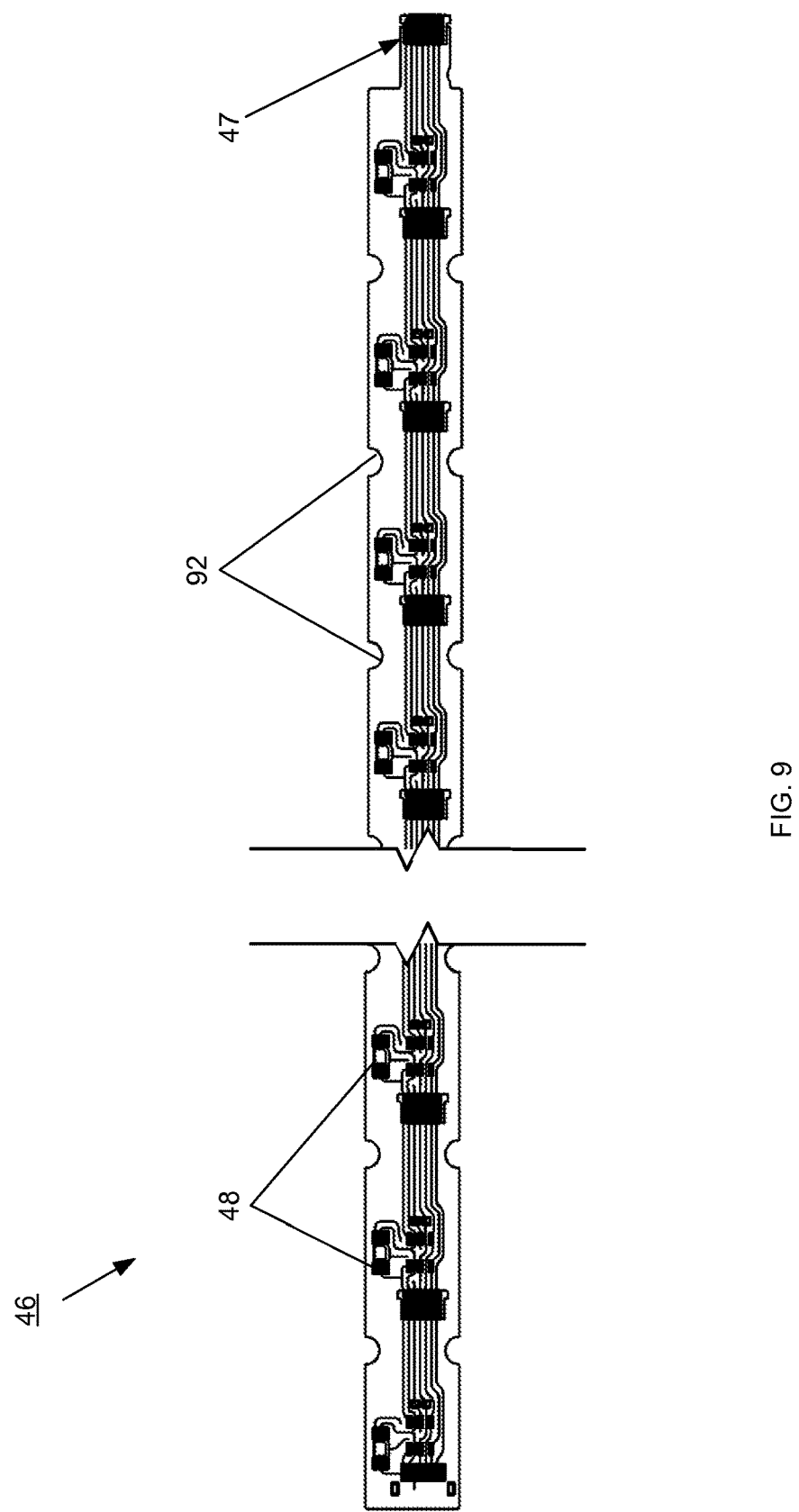
FIG. 9 depicts a flexible circuit board.

The "guts" of leg 28 include the screw assembly 41, which sits above bobbin 40, and flexible circuit board 46 including Hall effect sensors 48 (seen best in FIG. 9). Screw assembly 41 and bobbin 40 are connected, as shown in FIGS. 5 and 6. Screw assembly 41, best shown in FIG. 7, positions sensor control module current input 37 (see FIG. 1) for measuring current. Specifically, when clamp screw 85 is rotated, screw lock clamp 84 with moveable plate 82 moves downwardly within screw lock box 83, thereby clamping sensor control module current input 37 (not shown) between screw lock box 83 and moveable plate 82. Clamp screw 85 preferably defines a cold head, for Phillips and straight screw drivers.

Figure 8:
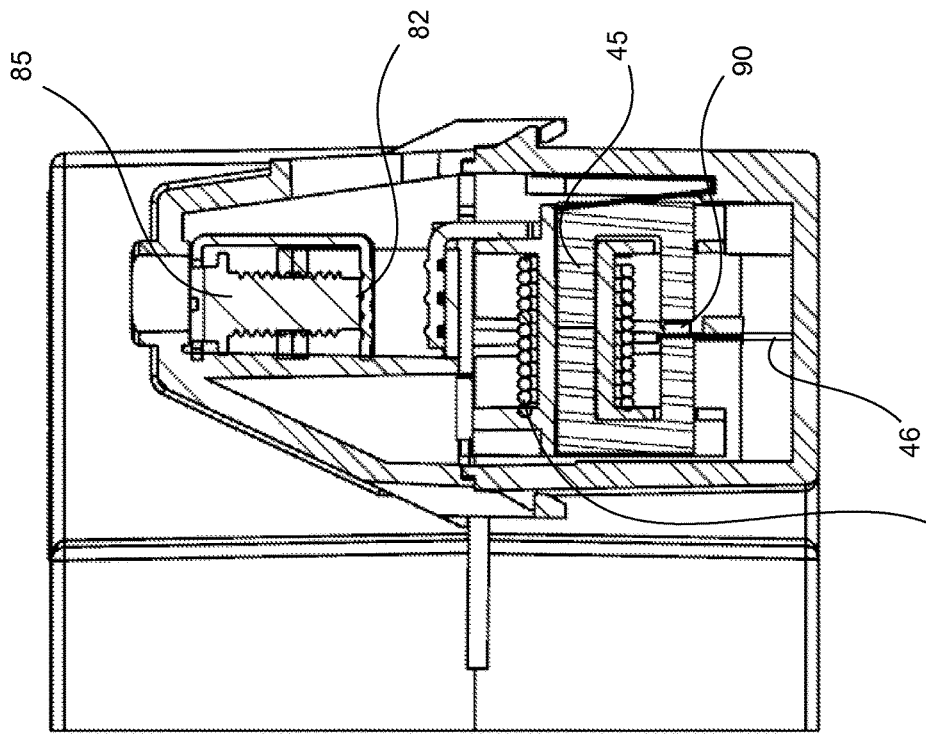
FIG. 8 is a side view of a core with flexible circuit board passing though.

Referring to FIG. 5, screw assembly terminates in dual bobbin input terminals 42, and bobbin output terminal 44, which is in communication with string monitor terminal 88. Between input 42 and output 44 terminals, is ferrite core 45, with wire windings 43 wrapped around. As best shown in FIG. 8, the lower portion of core 45 defines gap 90. In use, current from sensor control current input strings 37a-37j is carried down screw terminal 41 to bobbin input terminals 42, across windings 43, through string monitor terminal 88, through fuses 26, then to bus bar 38. Wire windings 43 can be varied with respect to wire material, wire gauge, and number of turns according to the amount of current that is to be sensed. For example, for a system that senses current in the range of 8 A to 12 A, a #10 gauge wire constructed of copper magnet wire with two evenly spaced windings would be appropriate. Core 45 is preferably manufactured in two separate pieces, and joined in the assembly process since windings 43 must be positioned around core 45.

Referring now to FIG. 8, the lower portion of core 45 includes gap 90, through which flexible circuit board 46 (shown in profile), including Hall effect sensor 48, passes. In this manner, Hall effect sensor 48 senses the magnetic field between two core 45 ends at gap 90 when current passes through windings 43. Flex circuit holders 91 in leg base 31 (FIG. 2) hold flexible circuit board 46 in position by defining notches 49 into which board 46 fits. Windings 43 wrap around the upper portion of core 45, but are depicted partially removed in FIG. 8 for purposes of clearly showing the orientation of core 45.

As shown in FIG. 9, flexible circuit board 46 includes Hall effects sensors 48, and pad stack 47, which connects to printed circuit board 65. Flexible circuit board 46 is preferably manufactured with multiple Hall effect sensors 48, separated by opposing pairs of cut outs 92, and terminating in a single pad stack 47. This permits one long flexible circuit board 46 to be adapted according to the number of fuses 26 by simply severing at cut outs 92. For example, flexible circuit board 46 preferably provides sixteen Hall effect sensors 48 and pairs of cut outs 92, but for use in a system with 12 fuses 26, the flexible circuit board is cut at the $12^{th}$ set of cut outs 92, counting from the end that includes pad stack 47.

Turning back to FIG. 1, bus bar 38 is engaged with foot 29, and fuses 26, and senses the voltage of the overall system. This data is communicated to brain 63, then RF controller 50 via control module multi-conductor cable 54, which is an $I^2C$ communication protocol, and also provides power. As used herein, brain 63 refers collectively to flexible circuit board 46 and printed circuit board 65, and is responsible for transferring voltage, "V-out", from hall-effect sensor(s) 48 located on the flexible circuit board 46. As would be understood by those skilled in the art, V-out is created by hall-effect sensor 48, and is a voltage proportional to that of the current passing through the respective windings 43 of associated bobbin 40. In addition, brain 63 measures voltage directly from bus bar 38. These data are assimilated and transferred to the RF controller 50 via I2C protocol. It should be noted that control module multiconductor cable 54 included low voltage, power, ground, shield, data and clock conductors, with data and clock forming the communication protocol.

In order to facilitate flexibility of the system, length of leg 28 can be varied to accommodate different quantities of fuses. For example, lid 32 preferably defines 16 apertures 35, but leg 28 can be shortened by clipping, sawing, cutting or the like to accommodate as few as 1 fuse 26. Likewise, monitoring system 10 is capable of handling many fuses 26, depending upon recombiner box. System 10 preferably monitors up to 32 strings without excessive redundancy. Leg end cap 33 (FIG. 2) snaps onto end of leg 28 to allow for such modifications. By easily varying the length of the flexible circuit board 46 and leg 28, monitoring system 10 can easily accommodate systems with few or many arrays 13.

Figure 11:
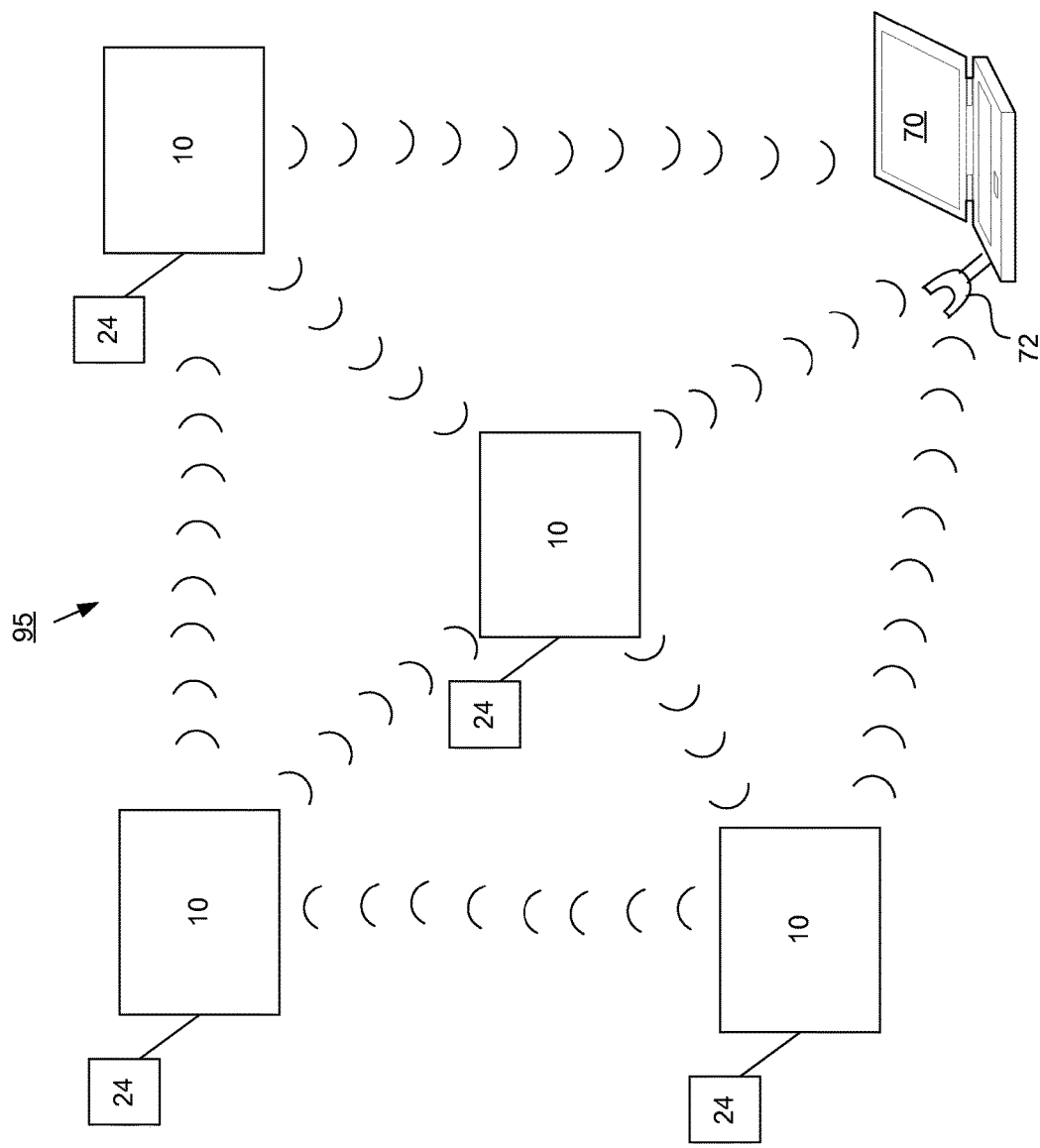
FIG. 11 schematically represents a mesh network.

As shown in FIG. 11, systems 10 can be interconnected to form a mesh network 95. Specifically, each array 13 is in communication with the associated monitoring system 10, and each monitoring system 10 is in communication with at least one nearby monitoring system 10, and capable of exchanging RF signals 52 therewith. This range of communication between systems 10 is within line of sight, up to a maximum of approximately 5,000 feet. In this manner, RF signals 52 from various systems 10 in the network ultimately end up being received by RF dongle 72 of processor 70, and follow the best path to the internet connection.

An example of the system is a 5.5 MW installation including 12,000 panels 15 from First Solar, Inc. of Tempe, Ariz., model number FS-270. These panels are wired in series in the field using 10-string wire harnesses (aka monitoring input branch 18) from Shoals Technologies Group in Portland, Tenn. Accordingly, each array 13 includes ten panels 15. These wire harnesses go into combiner boxes 25, with each combiner box 25 accommodating 15 wires (input branches 18), which correspond with 15 arrays. The combiner boxes are available from Shoals Technologies Group as combiner box STG-CBC-15×25. Sensor control module current inputs 37 connect inside the combiner box to the sensor control module 30. Data from sensor control module 30 is relayed by RF controller 50 to the central processor (70) on the site. The current and power output of each array 13 in the field is monitored over the internet with the correct password.

Certain modifications and improvements will occur to those skilled in the art upon a reading of the foregoing description. By way of example, it is possible to add features to the system such as an indicator when a fuse is blown. Also, the system includes extra expansion slots, an expansion pack of sorts, for a variety of functionality such as interfacing with glass temperature gauges or other devices as desired by an end user. Moreover, the dashboard software can be modified to alert a user, or users, to a variety of conditions, for example when the energy output of one panel is significantly lower than others nearby, or when there is a significant decrease in energy output without a corresponding decrease in ambient temperature. These anomalies may indicate that panels in the field require attention because they are, for example, shaded, dirty, or broken. Also, the system could be configured to be a separate "per string monitor" that would permit every string to have its own module, versus integration into a large "L" system. It is also possible to integrate the current sensing into the "fuse holder." In addition, it is possible to configure the system to monitor more than 32 strings at a time without excessive redundancy. It should be understood that all such modifications and improvements have been deleted herein for the sake of conciseness and readability but are properly within the scope of the following claims.

I claim:

1. A solar monitoring system comprising:
   A) A plurality of solar panels;
   B) One (re)combiner box for aggregating DC power, said (re)combiner box electrically coupled to said plurality of solar panels and including a fuse bar having a plurality of fuses;
   C) One sensor control module configured to be plugged into said fuse bar as a solitary unit, said sensor control module including a base with a plurality of locking mechanisms and a lid with corresponding locking mechanisms, said lid defining a plurality of apertures, said sensor control module located within said (re) combiner box and including a plurality of outwardly extending string monitor terminals positioned in a line with each of said string monitor terminals in a fixed position relative to each other while plugged into said fuse bar and while unplugged from said fuse bar, each of said string monitor terminals plugged into a corresponding fuse in said fuse bar, whereby said sensor control module is in communication with said plurality of solar panels, and wherein said sensor control module includes bobbins, the quantity of said bobbins equal to the quantity of said fuses, and said bobbins each including a core comprised of at least two separate portions;
   D) An RF controller in communication with said sensor control module, said RF controller including an antenna for wirelessly transmitting a signal; and
   E) A receiver for said signal.

2. The system of claim 1 wherein said sensor control module includes at least one current sensor.

3. The system of claim 2 wherein the number of said current sensors is equal to the number of said arrays.

4. The system of claim 1 wherein said sensor control module includes a voltage sensor.

5. The system of claim 1 wherein said RF controller includes a temperature circuit.

6. The system of claim 1 wherein said receiver is in communication with a processor, said processor configured to interpret said signal, and display said interpretation within an interface.

7. A monitoring system for an array of solar panels, said system comprising:
   A) A (re)combiner box for aggregating DC power electrically coupled to an array of solar panels, said (re) combiner box including at least one fuse bar with a plurality of fuses;
   B) An "L"-shaped sensor control module configured to be plugged into said fuse bar as a solitary unit, said sensor control module including an "L"-shaped base with a plurality of locking mechanisms and an "L"-shaped lid with a plurality of corresponding locking mechanisms, said "L"-shaped lid defining a plurality of apertures, the leg of the sensor control module including a plurality of outwardly extending string monitor terminals positioned in a line parallel to said fuse bar with each of said string monitor terminals in a fixed position relative to each other while plugged into said fuse bar and while unplugged from said fuse bar, wherein each of said string monitor terminals is plugged into a corresponding fuse, and wherein said leg of the sensor control module includes bobbins, the quantity of said bobbins equal to the quantity of said fuses, and said bobbins each including a core comprised of at least two separate portions; and
   C) A bus bar engaged with the foot of the "L", said bus bar parallel to, and engaged with, said fuse bar.

8. The monitoring system of claim 7 further comprising an RF controller in communication with said sensor control module, said RF controller including an antenna.

9. The monitoring system of claim 7 wherein said sensor module leg includes current sensors, the quantity of said current sensors equal to the quantity of said fuses.

10. The monitoring system of claim 9 wherein said current sensors are Hall effect sensors.

11. The monitoring system of claim 7 wherein said sensor module leg includes bobbins, the quantity of said bobbins equal to the quantity of said fuses, and said bobbins each including a screw assembly with a movable plate.

12. A system of collecting solar energy, said system including:
- A) A plurality of solar panels, each solar panel in communication with a single (re)combiner box for aggregating DC power having a plurality of fixed fuses;
- B) A single sensor control module configured to be plugged into said fixed fuses as a solitary unit, said sensor control module having a plurality of protruding rigid string monitor terminals positioned in a line with each of said string monitors in a fixed position relative to each other while plugged into said fixed fuses and while unplugged from said fixed fuses, each one of said string monitor terminals plugged into exactly one fixed fuse, said sensor control module in communication with said plurality of solar panels, and said sensor control module having a housing formed of a base with a plurality of locking mechanisms and a lid with corresponding locking mechanisms, said lid defining a plurality of apertures, said sensor control module located within and integrated with said (re)combiner box, and wherein said sensor control module includes bobbins, the quantity of said bobbins equal to the quantity of said fuses, and said bobbins each including a core comprised of at least two separate portions;
- C) An RF antenna in communication with said sensor control module; and
- D) At least one receiver in communication with said RF antenna.

13. The system of claim 12 wherein said at least one receiver is in communication with at least one processor.

14. The system of claim 12 further comprising at least one additional plurality of solar panels, said plurality and said additional plurality in communication one with another.

* * * * *